United States Patent
Kato et al.

(10) Patent No.: US 7,285,803 B2
(45) Date of Patent: Oct. 23, 2007

(54) LIGHT-EMITTING DIODE LAMP HAVING A TERMINAL PORTION WITH A NOTCH PORTION

(75) Inventors: Hideaki Kato, Aichi-ken (JP); Kanae Matsumura, Aichi-ken (JP); Shunsuke Ohtsuka, Tokyo (JP)

(73) Assignees: Toyoda Gosei Co., Ltd., Nishikasugai-Gun, Aichi-Ken (JP); Koha Co., Ltd., Tokyo (JP)

( * ) Notice: Subject to any disclaimer, the term of this patent is extended or adjusted under 35 U.S.C. 154(b) by 197 days.

(21) Appl. No.: 10/911,643

(22) Filed: Aug. 5, 2004

(65) Prior Publication Data

US 2005/0030762 A1 Feb. 10, 2005

(30) Foreign Application Priority Data

Aug. 6, 2003 (JP) ............................. 2003-288294

(51) Int. Cl.
*H01L 33/00* (2006.01)
(52) U.S. Cl. .............................. 257/99; 257/81; 257/91
(58) Field of Classification Search ................. 257/79, 257/81, 99, E25.005, E25.002, 91
See application file for complete search history.

(56) References Cited

U.S. PATENT DOCUMENTS

| 4,060,822 | A | * | 11/1977 | Jantsch et al. | 257/429 |
| 4,700,076 | A | * | 10/1987 | Dorman et al. | 257/E25.005 |
| 4,999,077 | A | * | 3/1991 | Drake et al. | 257/E25.005 |
| 5,068,713 | A | * | 11/1991 | Toda | 257/680 |
| 5,545,913 | A | * | 8/1996 | Quinn et al. | 257/443 |
| 5,663,573 | A | * | 9/1997 | Epstein et al. | 257/40 |
| 6,707,069 | B2 | * | 3/2004 | Song et al. | 257/79 |
| 6,787,890 | B2 | * | 9/2004 | Huang et al. | 257/680 |

FOREIGN PATENT DOCUMENTS

| JP | 9-181359 | | 7/1997 | |
| JP | 2000-244022 | | 9/2000 | |
| JP | 2000-244022 | A * | 9/2000 | 257/E33.057 |

OTHER PUBLICATIONS

Chinese Office Action dated Sep. 8, 2006 (with English translation).

* cited by examiner

*Primary Examiner*—Jong-Suk (James) Lee
*Assistant Examiner*—Ismael Negron
(74) *Attorney, Agent, or Firm*—McGinn IP Law Group, PLLC

(57) ABSTRACT

A notch portion 7A is disposed on a formation surface of a wiring pattern 7 and is located in a contact point with a wiring pattern 9 of an outside substrate 8, so that a solder 9a melted by reflow soldering slowly flows up along an edge of the notch portion 7A, improving a solder-joint performance. The notch portion 7A is formed in a recess shape as formed by cutting away the substrate 6 and as a result, the melted solder stays in the recess portion, which prevents the melted solder from moving up over the notch portion 7A.

14 Claims, 9 Drawing Sheets

1

LIGHT-EMITTING DIODE LAMP HAVING A TERMINAL PORTION WITH A NOTCH PORTION

The present application is based on Japanese patent application No. 2003-288294, the entire contents of which are incorporated herein by reference.

BACKGROUND OF THE INVENTION

1. Field of the Invention

The present invention relates to a light-emitting diode lamp and in particular to a light-emitting diode lamp adapted to regulate flow of solder in soldering.

2. The Related Art of the Invention

There is known a light-emitting lamp that has a light-emitting diode (to be referred to as LED hereinafter) as a light source. Such light-emitting lamp has an advantage that use of the LED as a light source allows the lamp to have a good lighting performance with a low electrical power consumption, as well as an excellent mounting performance in mounting the lamp to various electronic devices requiring a light source.

Recent progress in miniaturization of an electric device or the like requires further miniaturization of a light-emitting lamp, which raises problems with heat dissipation of heat generated in lighting a LED and a mounting performance of the lamp. In particular, with respect to the mounting performance the miniaturization of the light-emitting lamp results in further reduced mounting areas thereof, which causes the difficulty of securing a sufficient solder-joint strength, as well as an electrical connection in the light-emitting lamp.

In order to solve the above-described problems there exists a light-emitting lamp where a plurality of concave portions are formed in a bottom surface of the light-emitting lamp each of which is sufficient in size to receive a bump made of a ball-shaped solder, and the solder-joint strength in the light-emitting lamp is designed to be secured by the bottom and the side surface of each concave portion as a solder-joint surface (refer to Japanese Unexamined Patent Publication No. 2000-244022).

FIG. 1 is a cross sectional view of a light-emitting diode lamp disclosed in Japanese Unexamined Patent Publication No. 2000-244022. The light-emitting diode lamp 30 is constructed of an insulating substrate 31, and a sheet material 50 adhered to the insulating substrate 31 through an adhesive film 40.

The insulating substrate 31 includes a bore 31A receiving a LED chip 32, and a first and a second plating layer 54 are disposed in a bottom portion of the bore 31A. The LED chip 32 is mounted on the first plating layer 54 and an upper surface electrode of the LED chip 32 is electrically connected through a wire 33 to the second plating layer 54 having a different polarity.

The sheet material 50 is constructed to cover undersurfaces of metallic sheet materials 51, 52, with an insulating resin 53, which also are electrically insulated through a separation portion 53A of the insulating resin 53 from one another. And concave openings for disposing bumps 55 are formed in the undersurface of the sheet material 50 and the metallic materials 51, 52 are covered with the plating layers 54 on which the bumps 55 are located so that the materials 51, 52 are not exposed to the concave openings According to such construction, both the bottom portion and the side surface of each concave portion covered with the plating layer 54 become a joint surface to the solder in performing solder jointing by melting the bumps, thereby to improve solder-joint performance.

SUMMARY OF THE INVENTION

According to the light-emitting diode lamp described in Japanese Unexamined Patent Publication No. 2000-244022, however, a bump formation process is required for disposing the bump 55 in the undersurface of the sheet material 50, causing an increase of manufacturing processes. Also whether or not a good solder-joint performance in the light-emitting diode lamp is achieved depends on a shape or a melting performance of the bump 55. Therefore, it is required to maintain a formation stability of the bump at a certain level for a good solder-joint performance, and as a result, a problem with an increase of manufacturing costs occurs.

In view of the above, there exists a need for a light-emitting diode lamp which overcomes the above-mentioned problems in the related art. The present invention addresses this need in the related art as well as other needs, which will become apparent to those skilled in the art from this disclosure.

An object of the present invention is to provide a light-emitting diode lamp, which can easily obtain a stable solder-joint performance.

One aspect of the present invention, in order to achieve the above-mentioned object, provides a light-emitting diode lamp which includes a casing, a light-emitting diode disposed in the casing, and a terminal portion connected at one side to the light-emitting diode and soldered at the other side to an outside. The light-emitting diode lamp includes a notch portion which is formed in the terminal portion to flow a solder into the notch portion.

In the above light-emitting diode lamp, a sheet material is provided between the terminal portion and the casing, wherein a second notch portion is formed in the sheet material to correspond to the above portion in the terminal portion.

In the light-emitting diode lamp, a plurality of ceramic sheet materials are disposed to form the casing, and a plurality of ceramic sheet materials are disposed between the casing and the terminal portion where these ceramic sheet materials are integrally formed by laminating and burning.

One aspect of the present invention is to provide a light-emitting apparatus comprises a casing, a light-emitting diode received in a bore formed in the casing, a terminal portion connected to the light-emitting diode, and an outside substrate having a wiring pattern connected to the terminal portion. And a solder-flowing recess is formed between the terminal portion and the wiring pattern to flow a solder on the wiring pattern into the solder-flowing recess.

In the above light-emitting apparatus, the solder-flowing recess includes a notch portion formed in the terminal portion, as well as a groove portion formed in the wiring pattern to be opposite to the notch portion, and the light-emitting diode includes a plurality of the light-emitting diodes. And the groove portion is located deviated from the notch portion by a small margin.

One aspect of the present invention is to provide a light-emitting apparatus comprises a lamp which includes a casing formed of a plurality of sheet materials, an array of a plurality of light-emitting diodes disposed in a bore of the casing, a first wiring pattern connected to the light-emitting diodes, a terminal portion connected to the first wiring pattern, and a plurality of sheet materials disposed between the terminal portion and the casing. And the apparatus also comprises an outside substrate having a second wiring pattern soldered to the terminal portion where a notch portion is formed in the terminal portion to be positioned in a cutting surface generated in cutting a collection of the lamps to produce the lamp.

According to one aspect of the present invention, the solder-flowing recess for inflow of the solder is formed between the terminal portion of the lamp and the outside thereof to enable supply of an appropriate amount of the solder, so that stable solder-joint performance can be easily obtained.

These and other objects, features, aspects and advantages of the present invention will become apparent to those skilled in the art from the following detailed description, which, taken in conjunction with the annexed drawings, discloses a preferred embodiments of the present invention.

BRIEF DESCRIPTION OF THE DRAWINGS

Referring now to the attached drawings which form a part of this original disclosure:

FIG. 5 is a partially enlarged view showing a solder flown into a notch portion in a terminal portion of the light-emitting diode lamp, wherein

FIG. 6 is a process chart showing a manufacturing process of the light-emitting diode lamp, wherein

DETAILED DESCRIPTION OF THE PREFERRED EMBODIMENTS

Selected embodiments of the present invention will now be explained with reference to the drawings. It will be apparent to those skilled in the art from this disclosure that the following description of the embodiments of the present invention is provided for illustration only, and not for the purpose of limiting the invention as defined by the appended claims and their equivalents.

First Embodiment

Figure 1:
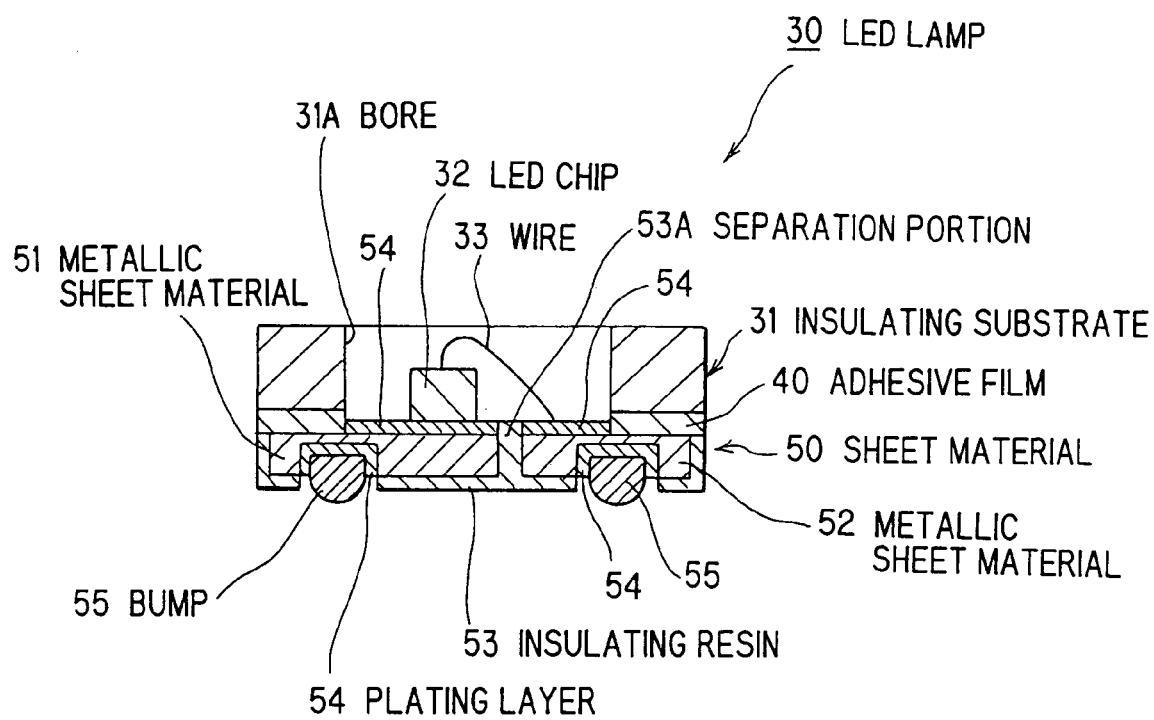
FIG. 1 is a cross sectional view of a light-emitting diode lamp described in the related art.
Figure 2:
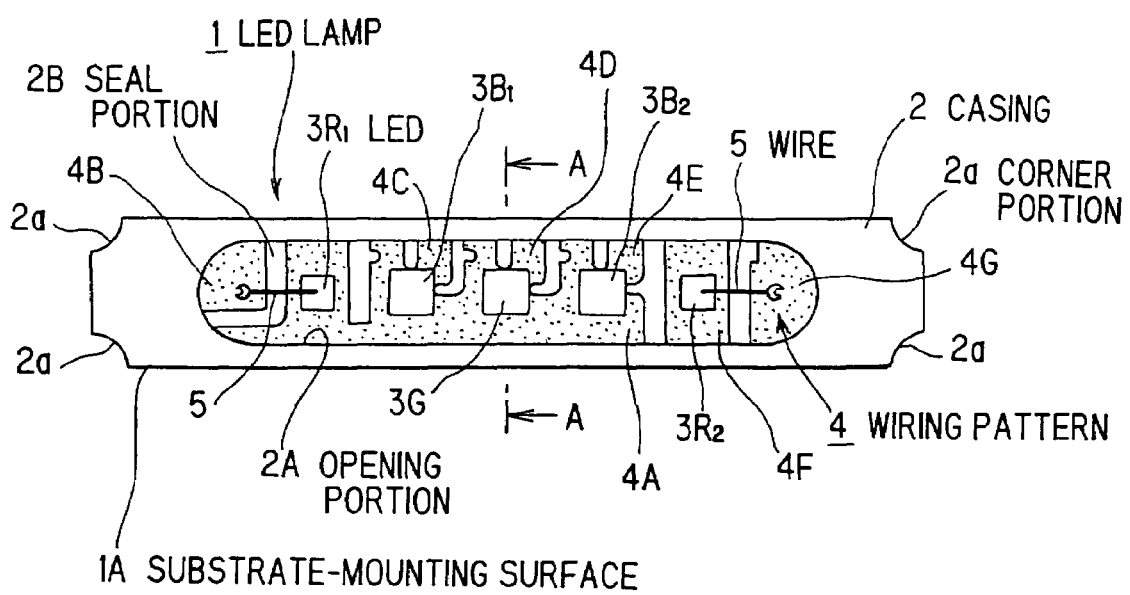
FIG. 2 is a front view of a light-emitting diode lamp of a first embodiment according to the present invention.

FIG. 2 is a front view of a light-emitting diode lamp of a first embodiment according to the present invention. The light-emitting diode lamp 1 is provided with a casing 2 formed of laminating sheet materials, an array of light-emitting diodes (referred to as LED hereinafter) $3R_1$, $3R_2$, $3G$, $3B_1$, and $3B2$ received in an oval opening portion 2A of the case 2, and wiring patterns 4 disposed in a substrate to be described later for electrically connecting the LEDs, and the opening portion 2A is filled with a transparent epoxy resin as a seal resin to form a seal portion 2B, which protects each LED.

The casing 2 is formed by laminating a plurality of ceramic sheet materials where the LEDs $3R_1$, $3R_2$, $3G$, $3B_1$, and $3B_2$ are arranged in an array in the oval opening portion 2A to form a LED lamp. And the casing 2 includes corner portions 2a, each having a shape of an inverted arc.

The LEDs $3R_1$, $3R_2$ (red color) have electrodes on the upper surface and the bottom surface thereof and the electrode on the upper surface is electrically connected to the wiring patterns 4 through wires 5. And the LED 3G (green color), the LED 3B1 and LED $3B_2$ (both in blue color) have an electrode (not shown) on each bottom surface, and each electrode is electrically connected to the wiring patterns 4 through Au bumps. In addition, in the light-emitting diode lamp 1 shown in FIG. 2 the LEDs in RGB (red-green-blue) are arranged, but LEDs in one or two colors may be used.

The wiring patterns 4 are formed by laminating Au on a tungsten layer and made of a plurality of wiring areas 4A, 4B, 4C, 4D, 4E, and 4F. In the first embodiment the wiring area 4A is set as an anode and the wiring areas 4C, 4D, 4E, and 4G are set as a cathode. The wiring area 4B is electrically connected to the wiring area 4F by a wiring layer (not shown) disposed within a substrate cross section.

Figure 3:
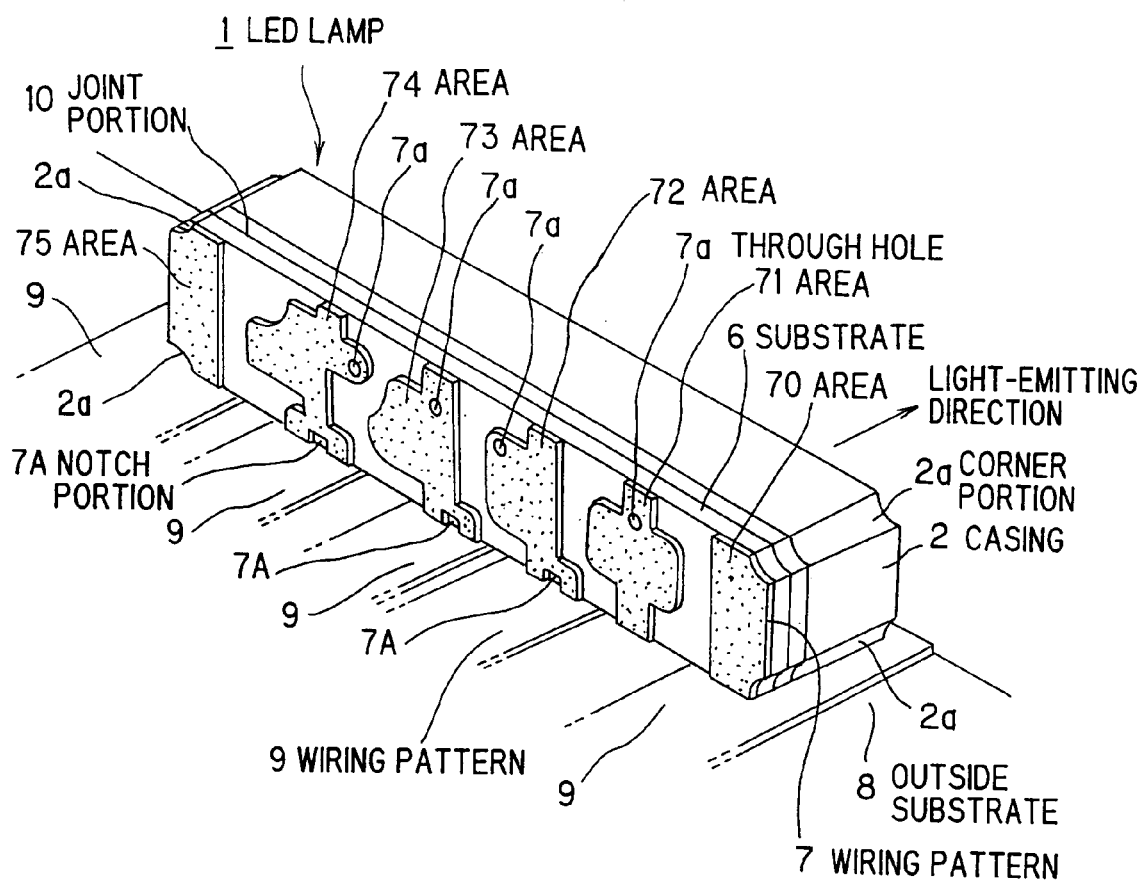
FIG. 3 is a perspective view of the light-emitting diode lamp.

FIG. 3 is a perspective view of the light-emitting diode lamp 1. This perspective view is a bottom-side perspective view on the opposite side of a light-emitting direction of the light-emitting diode lamp 1 mounted in an outside substrate 8. A substrate 6 which is formed by putting together ceramic sheet materials is disposed in a bottom surface of the light-emitting diode lamp 1, and wiring patterns 7 are disposed on one surface of the substrate 6. Herein FIG. 3 shows a state where the wiring patterns 7 are not yet soldered to the wiring patterns 9.

The wiring patterns 7 are formed by disposing Au on a tungsten layer and includes a plurality of areas 70, 71, 72, 73, 74, and 75, and through holes 7a for electrically connecting the wiring patterns 7 to the above-described wiring patterns 4 through the substrate 6. The areas 72, 73, and 74 are provided with notch portions 7A as solder-flowing recesses formed in a boundary portion to the wiring pattern by cutting away the wiring patterns 7 as well as the substrate 6 in a rectangular shape. And the area 70 is designed to flow the solder along a corner portion 2a as an inverted arc-shaped end.

The outside substrate 8 is provided with wiring patterns 9 on a surface of the glass epoxy substrate or the like formed in a pattern shape by a conductive film. In the embodiment each of the wiring pattern 9 is formed of a copper film, perpendicular to the wiring patterns 7 of the light-emitting diode lamp 1 and the solder (not shown) is disposed on surfaces of the wiring patterns 9.

Figure 4:
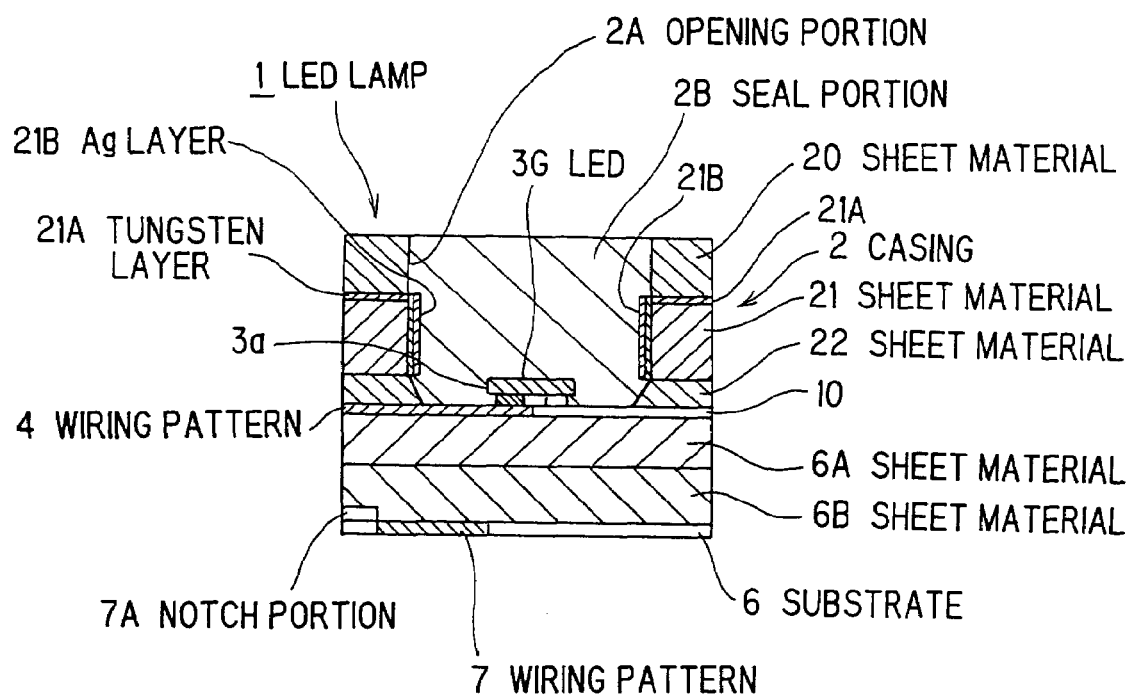
FIG. 4 is a cross sectional view of the light-emitting diode lamp taken in the lines A-A of FIG. 2.

FIG. 4 is a cross sectional view of the light-emitting diode lamp 1 taken in line A-A in FIG. 2. The casing 2 is formed by laminating three materials made of sheet materials 20, 21, and 22, and is jointed to the substrate 6 through a joint surface 10.

The sheet material 21 includes tungsten layers 21A on a boundary face with the sheet material 20 and on a surface exposed inside the opening portion 2A where an Ag layer 21B for reflecting light is laminated to the tungsten layer 21A exposed inside the opening portion 2A.

The sheet material 22 is so formed that a surface oblique in the depth direction of the opening portion 2A is formed.

The substrate 6 is formed by laminating ceramic sheet materials 6A, 6B where a wiring pattern (not shown) is disposed between the sheet materials 6A, 6B. And the sheet material 6B includes the notch portions 7A as the solder-flowing recess formed by cutting away portions of the sheet material 6B, as well as the wiring patterns 7 with etching or the like.

Figure 5A:
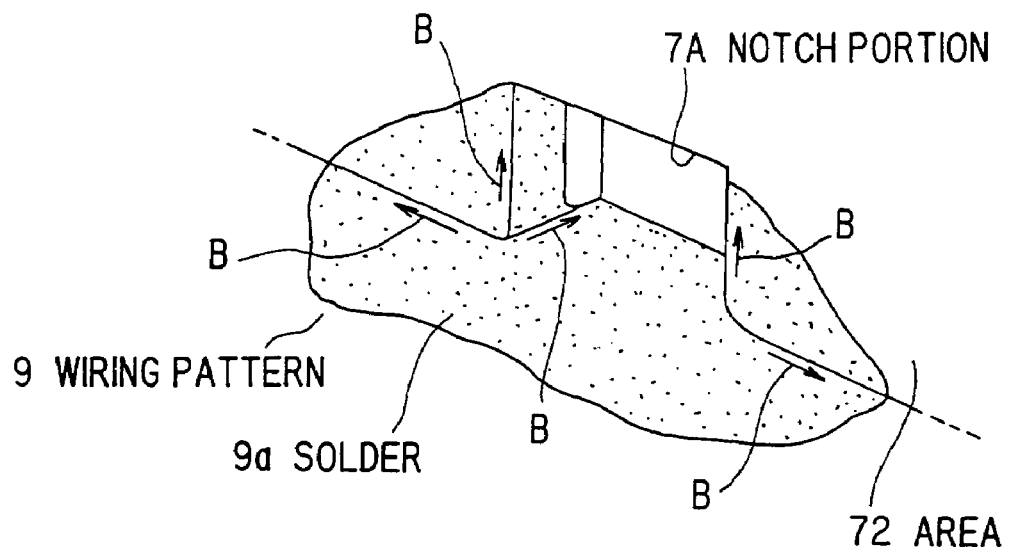
FIG. 5A is a view showing solder flow movement in reflow soldering and FIG. 5B is a view showing a state where the solder is solidified.
Figure 5B:
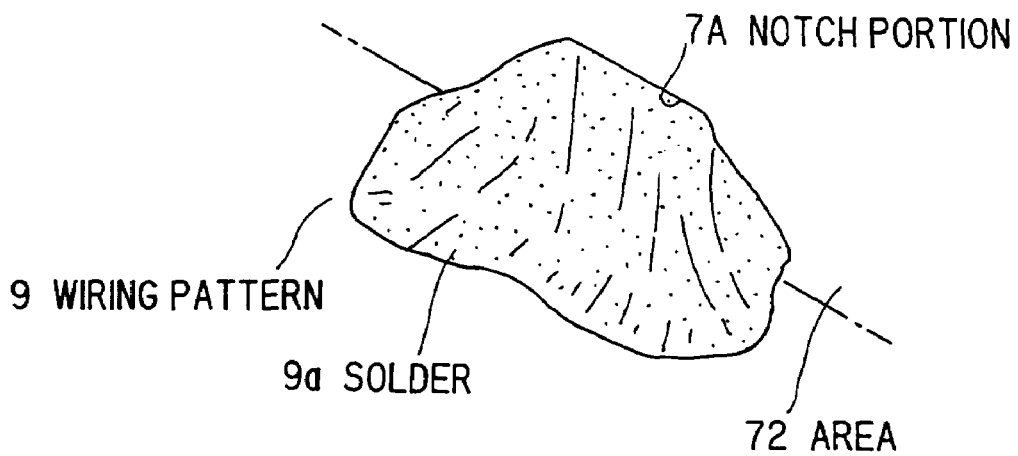

FIG. 5 is a partially enlarged view showing a solder flowing into the notch portion 7A. When reflow soldering is performed, as shown in FIG. 5A, in a state where the wiring pattern 9 is positioned as being perpendicular to the area 72, a solder 9a is melted and then moved into the notch portion 7A based upon capillary phenomenon as shown in arrows B. FIG. 5 B shows a state where the solder 9a is solidified, and the solder 9a solidified obliquely between the wiring pattern 9 and the area 72 is provided with an electrical connection therebetween. Also the flowing of the melted solder 9a in the upward direction is blocked at a top of the notch portion 7A, thereby to prevent the melted solder 9a from spreading across the entire area 72.

FIG. 6 is a process chart showing a manufacturing process of the light-emitting diode lamp. The manufacturing process of the light-emitting diode lamp will be explained based upon a flow chart shown in FIG. 7 as below.

(1) Sheet Material Preparation Process

Figure 6A:
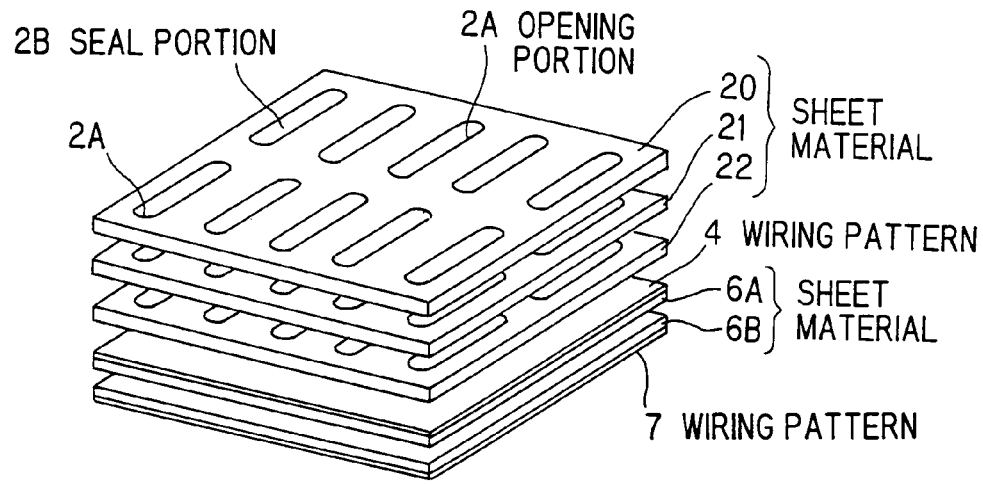
FIG. 6A is a view showing a sheet material preparation process.
Figure 7:
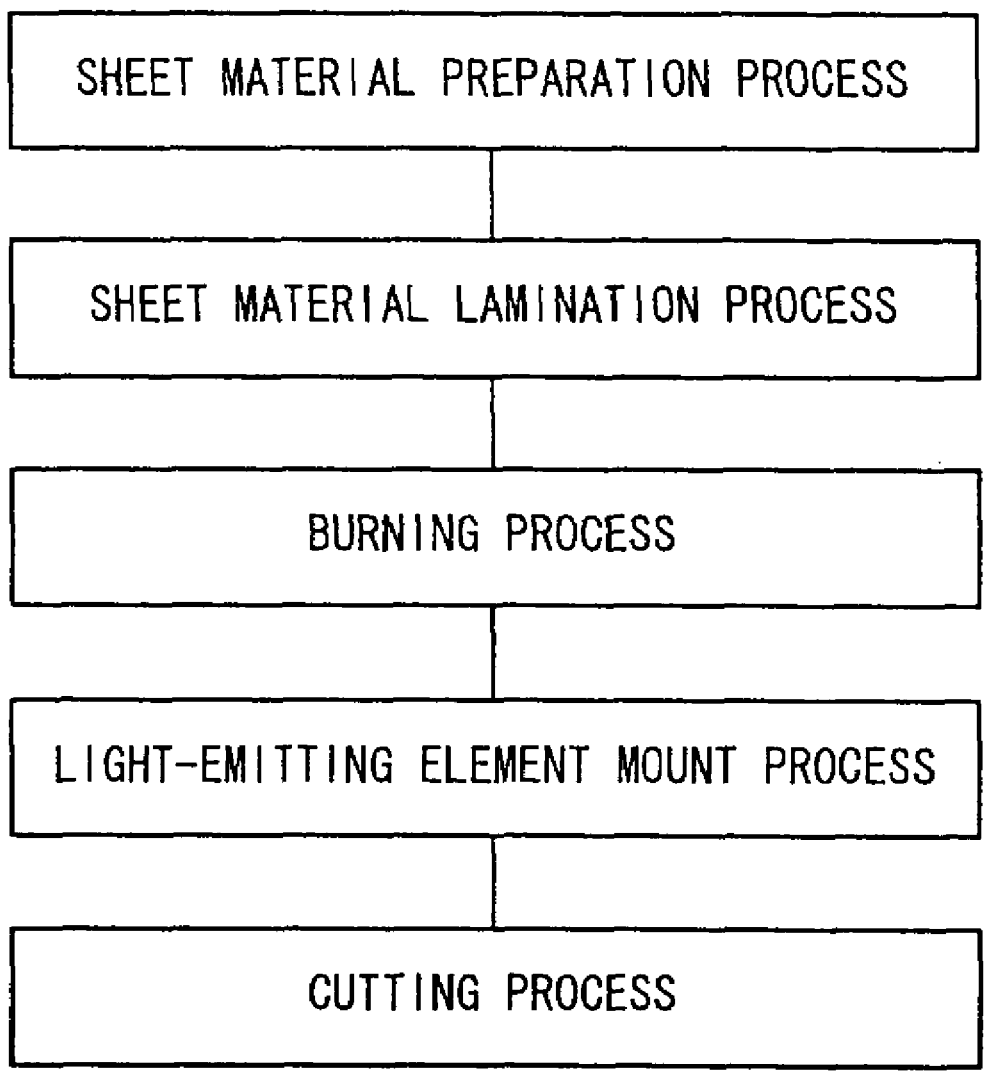
FIG. 7 is a flow chart of the manufacturing process of the light-emitting diode lamp.

First, as shown in FIG. 6A, the sheet materials 20, 21, and 22, the sheet material 6A with the wiring patterns 4 formed therein, and the sheet material 6B with the wiring patterns 7 formed therein are prepared.

Herein opening portions 2A, each having an ellipse shape, are formed in a advance in a predetermined array in the sheet materials 20, 21, and 22 by a different process, and an explanation of the different process is omitted.

Rectangular-recess portions are formed in a predetermined array on surfaces for formation of the wiring patterns 7 in the sheet material 6B. These recess portions are adapted to form the notch portions 7A on the formation surfaces of the wiring patterns 7 for the light-emitting diode lamp 1 by cutting out the light-emitting diode lamp 1 at a cutting process to be described later.

And FIG. 6 omits the inverted arc-shaped corner portion 2a of the light-emitting diode lamp 1 explained FIG. 2 and FIG. 3.

The opening portions 2A of the sheet material 21 are formed in advance in a different process and thereafter, a tungsten film is formed on an upper surface of the sheet material 21 and an inner wall surface of each opening portion 2A based upon thin-film formation processing.

(2) Sheet Material Lamination Process

Figure 6B:
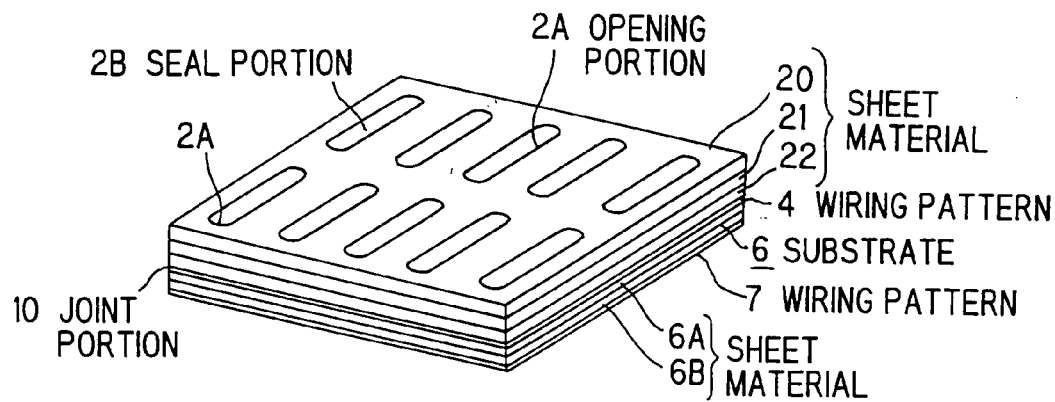
FIG. 6B is a view showing a sheet material lamination process.

Next, as shown in FIG. 6B, the sheet materials 20, 21, and 22, and the sheet materials 6A and 6B are laminated. This lamination process is carried out with the sheet materials 20, 21, and 22 positioned in place so that the ellipses formed respectively in the sheet materials 20, 21, and 22 do not become out of position from one another. In this state, a collection is formed by integrally arraying a plurality of the light-emitting diode lamps.

(3) Burning Process

Next, the respective ceramics are burned by performing burning processing to the collection thereof, and as a result, the sheet materials 20, 21, and 22, and the sheet materials 6A and 6B are integrated.

(4) Mounting Process of Light-Emitting Element (Diode)

Next, with respect to the collection shown in FIG. 6B, Au layers are formed in exposure portions of the wiring patterns 4, 7. Then Five LEDs are mounted inside the opening portion 2A and a part of them is wire-bonded to the wiring patterns 4.

(5) Cutting Process

Figure 6C:
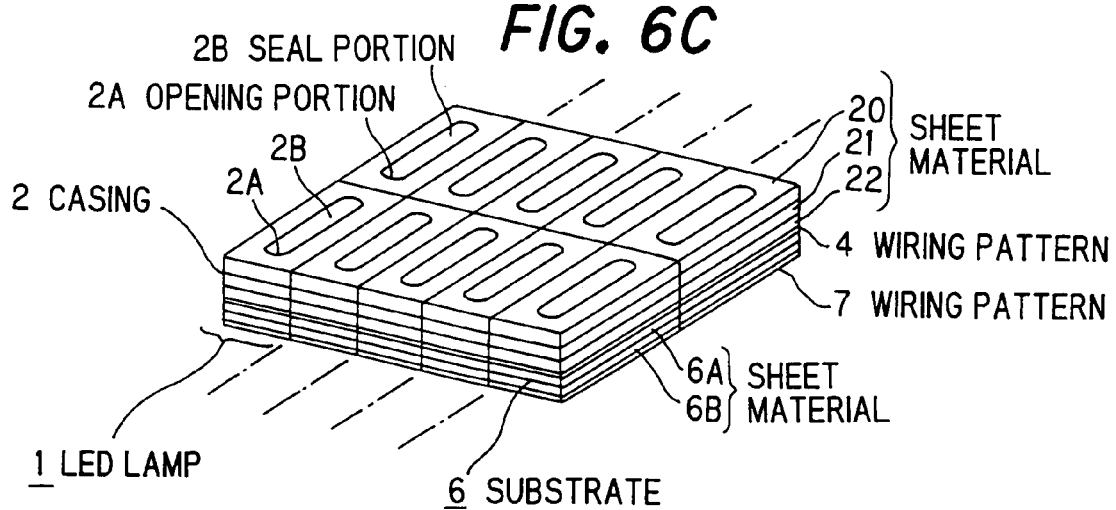
FIG. 6C is a view showing a cutting process.

Next, as shown in FIG. 6C, the light-emitting diode lamp 1 is produced by cutting the collection with dicing or the like.

The following effects can be obtained according to the first embodiment described above.

(1) Since the notch portion 7A is disposed as the solder-flowing recess on the formation surface of each of the wiring pattern 7, the solder 9a melted by reflow soldering slowly flows up along an edge of each notch portion 7A, improving a solder-joint performance.

(2) Since the notch portion 7A is formed in a recess shape as formed by cutting away the substrate 6, the melted solder stays in the recess, which prevents the melted solder from moving up over the notch portion 7A. In case the solder 9a moves up by a large margin along the wiring pattern 7, the whole weight balance of the light-emitting diode lamp 1 becomes off, which functions so as to make the formation surfaces of the wiring patterns 7 be directed to an under-surface side, possibly to allow the light-emitting diode lamp 1 to fall down. According to the first embodiment, losing the weight balance of the light-emitting diode lamp is blocked due to no possibility that the solder 9a moves up over the notch portion 7A.

(3) Disposing the notch portion 7A to the wiring pattern 7 blocks generation of burrs at an end of the wiring pattern 7 in cutting out the light-emitting diode lamp 1 by dicing or the like, which prevents deterioration of wettability in the solder 9a and generation of defects such as pattern debonding.

(4) As a result of an improvement of solder-joint performance due to the notch portions 7A, heat generation caused by lighting the LEDs $3R_1$, $3R_2$, 3G, $3B_1$, and $3B_2$ can be transmitted to the wiring patterns 9 or the like through the solder-joint portion in an efficient way, thereby improving heat dissipation performance.

However, in the first embodiment it is explained that the opening portion 2A is filled with a transparent epoxy resin as a seal resin, but a wavelength conversion may be made by using an epoxy resin mixed with a fluorescent substrate excited by light radiated from the LEDs.

Second Embodiment

Figure 8A:
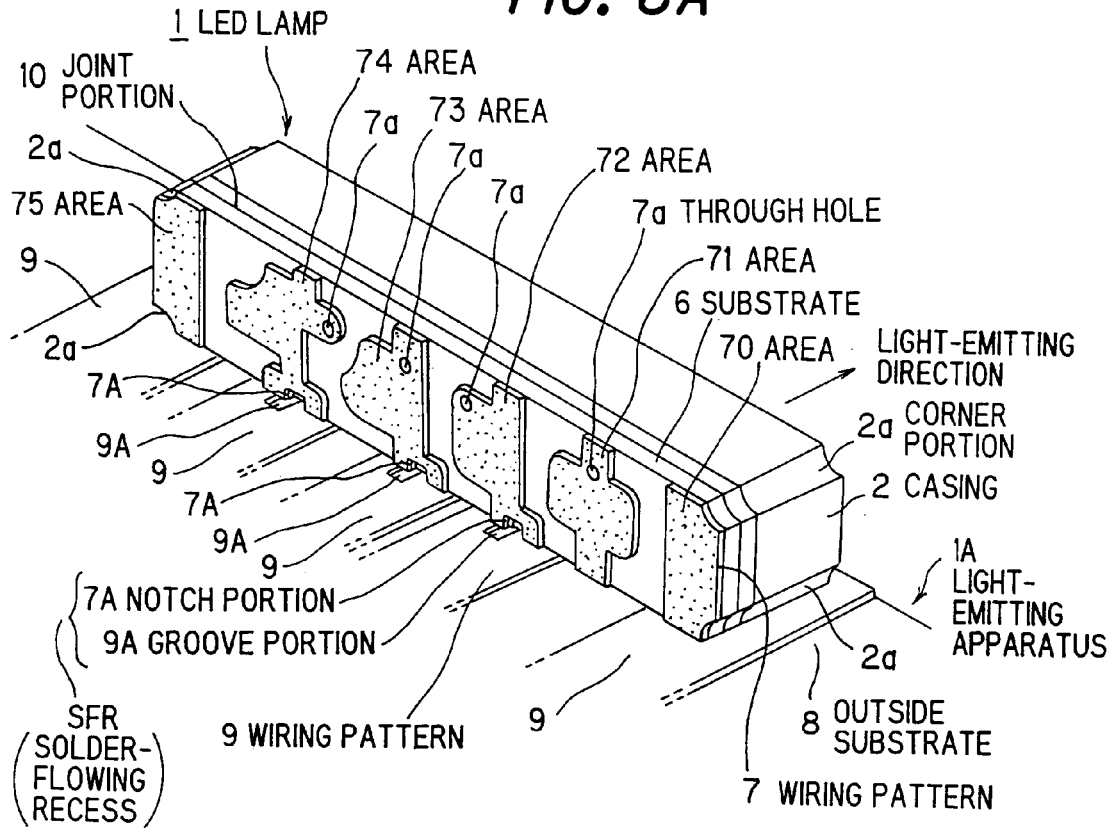
FIG. 8A is a perspective view of a light-emitting diode apparatus of a second embodiment.
Figure 8B:
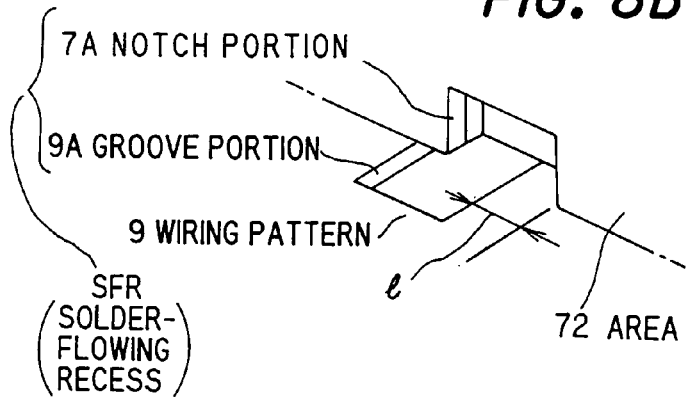
FIG. 8B is a partially enlarged view of a solder-flowing recess between both sides of a terminal portion of a light-emitting diode lamp and a wiring pattern of an outside substrate.

FIG. 8A is a perspective view of a light-emitting apparatus 1A of a second embodiment. FIG. 8B is a partially enlarged view of a solder-flowing recess SFR. This perspective view is a bottom-side perspective view opposite the light-emitting direction of the light-emitting diode lamp 1 mounted on the outside substrate 8. However, components identical to those in the first embodiment are referred to the same numbers.

According to the second embodiment, the solder-flowing recess SFR includes recess-shaped groove portions 9A formed in wiring patterns 9 of the outside substrate 8 and the notch portions 7A of the wiring patterns 7. The groove portions 9A are disposed opposite to the notch portions 7A, but each of the groove portions 9A, as shown in FIG. 8B, is arranged deviated by a length 1 from each of the notch portions 7A. Such groove portions 9A can be produced by partially removing the wiring patterns 9 and the outside substrate 8 by etching or the like.

According to the above-described second embodiment, the following effects are obtained.

(1) Since the groove portion 9A is disposed even in the wiring pattern 9 which is opposite the area where the notch portion 7A is arranged, edges in which the solder is easier to flow are increased, thereby improving a solder-joint performance.

(2) The melted solder stays not only in the notch portion 7A but also in the groove portion 9A, therefore improving a solder-joint performance, as well as efficiently preventing a large amount of the solders from moving up in the upper side of the wiring pattern 7.

(3) Since the wiring pattern 7 and the wiring pattern 9 are soldered in a state where the substrate mounting surface of the light-emitting diode lamp 1 and the outside substrate 8 are positioned in place, a positioning accuracy of the light-emitting diode lamp 1 is excellent.

However, in the second embodiment, the groove portion 9A of the wiring pattern 9 is positioned by a length 1 apart from the notch portion 7A, but the groove portion 9A may be disposed substantially corresponding to the position of the notch portion 7A.

Third Embodiment

Figure 9A:
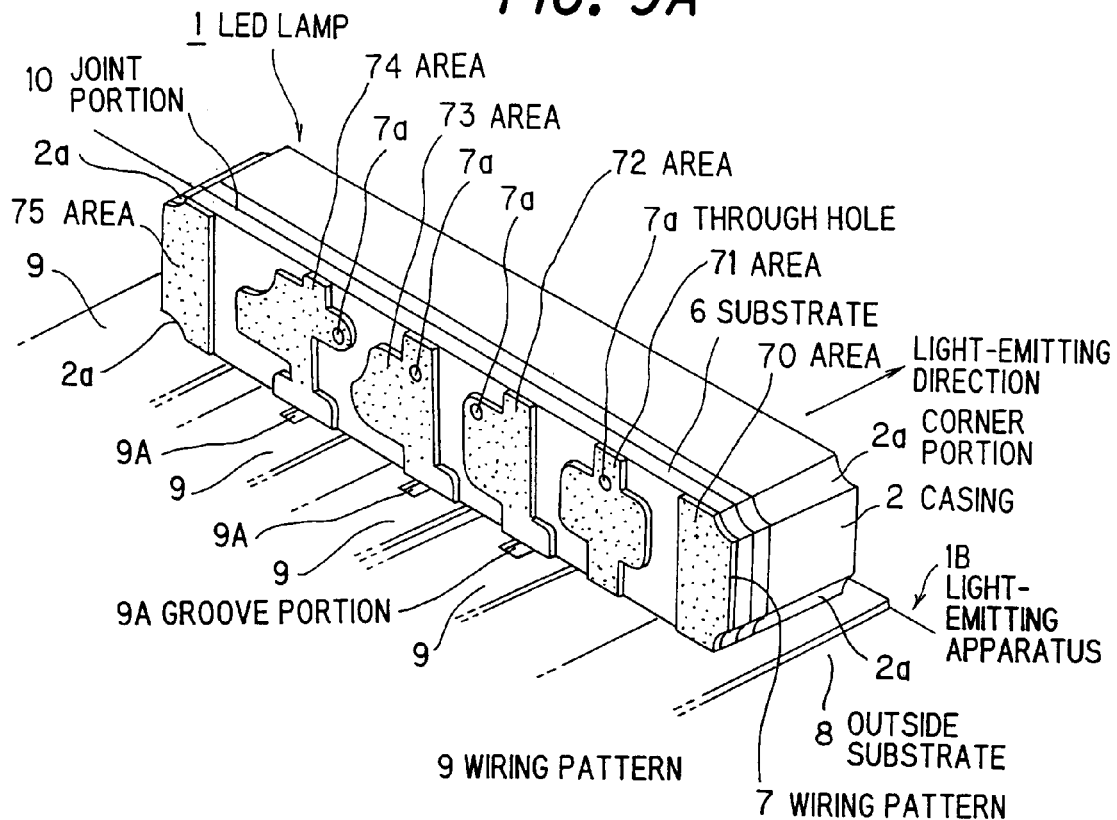
FIG. 9A is a perspective view of a light-emitting diode apparatus of a third embodiment.
Figure 9B:
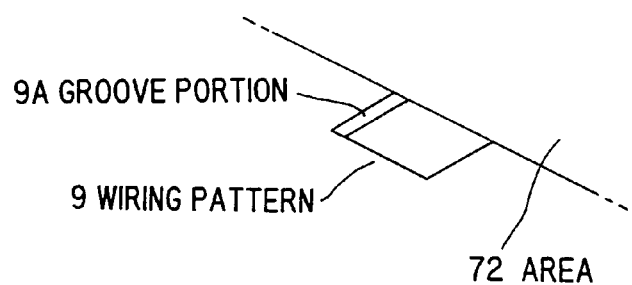
FIG. 9B is a partially enlarged view of a groove portion in the side of the wiring pattern of the outside substrate.

FIG. 9A is a perspective view of a light-emitting apparatus 1B of a third embodiment. FIG. 9B is a partially enlarged view of a groove portion as a solder-flowing recess. This perspective view is a bottom-side perspective view which is opposite the light-emitting direction of the light-emitting diode lamp 1 mounted on the outside substrate 8.

The third embodiment is constructed such that the groove portions 9A are disposed in the wiring patterns 9 without providing the wiring patterns 7 with any notch portion, which also prevents a large number of the solders from moving up.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

The present invention is not limited to the above-described embodiments, but various improvements and changes thereof apparent to those skilled in the art within the scope of the spirit of the present invention are included.

What is claimed is:

1. A light-emitting diode lamp, comprising:
a casing;
a light-emitting diode received in a bore of the casing; and
a terminal portion connected at one side to the light-emitting diode and at the other side to an outside substrate, wherein
a notch portion is formed in the terminal portion to flow a solder into the notch portion, and
the notch portion is formed through the terminal portion.

2. The light-emitting diode lamp as defined in claim 1, wherein the light-emitting diode includes a plurality of light-emitting diodes.

3. The light-emitting diode lamp as defined in claim 1, wherein the terminal portion comprises a conductive-thin film having a conductive pattern.

4. The light-emitting diode lamp as defined in claim 1, wherein
a first plurality of ceramic sheet materials are disposed to form the casing, and a second plurality of ceramic sheet materials are disposed between the casing and the terminal portion, the first and second plurality of ceramic sheet materials being integrally formed by laminating and burning.

5. The light-emitting diode lamp as defined in claim 1, wherein the outside substrate comprises a wiring pattern.

6. The light-emitting diode lamp as defined in claim 1, wherein the notch portion of the terminal portion is formed adjacent to the wiring pattern.

7. The light-emitting diode lamp as defined in claim 1, wherein said terminal portion comprises a plurality of terminal portions.

8. The light-emitting diode lamp as defined in claim 7, wherein said notch portion comprises a plurality of notch portions respectively formed in the plurality of terminal portions.

9. The light-emitting diode lamp as defined in claim 1, further comprising a sheet material between the casing and the terminal portion, wherein
a second notch portion is formed in the sheet material, the second notch portion being positioned corresponding to the notch portion.

10. The light-emitting diode lamp as defined in claim 9, wherein walls of the notch portion are aligned with walls of the second notch portion.

11. The light-emitting diode lamp as defined in claim 9, wherein walls of the notch portion are contiguous with walls of the second notch portion.

12. A light-emitting apparatus, comprising:
a casing comprising a plurality of sheet materials;
a light-emitting diode disposed in a bore of the casing;
a terminal portion connected to the light-emitting diode; and
an outside substrate comprising a wiring pattern connected to the terminal portion, wherein
a notch portion is formed in the terminal portion, wherein the notch portion is formed in a cutting surface of the plurality of the sheet materials, and the notch portion is formed through the terminal portion.

13. The light-emitting diode lamp as defined in claim 12, wherein the plurality of the sheet materials comprise a ceramic.

14. A light-emitting apparatus, comprising:
a casing;
a light-emitting diode received in a bore formed in the casing;
a terminal portion connected to the light-emitting diode; and
an outside substrate comprising a wiring pattern connected to the terminal portion, wherein
a solder-flowing recess is formed between the terminal portion and the wiring pattern to flow a solder on the wiring pattern into the solder-flowing recess,
the solder-flowing recess comprises a notch portion formed in the terminal portion, and a groove portion formed in the wiring pattern to be opposite to the notch portion, and
the groove portion is offset from the notch portion.

* * * * *